US009431579B2

(12) United States Patent
Wu et al.

(10) Patent No.: US 9,431,579 B2
(45) Date of Patent: Aug. 30, 2016

(54) SEMICONDUCTOR LIGHT EMITTING STRUCTURE AND SEMICONDUCTOR PACKAGE STRUCTURE

(71) Applicant: Genesis Photonics Inc., Tainan (TW)

(72) Inventors: Chih-Ling Wu, New Taipei (TW); Yi-Ru Huang, Tainan (TW); Yu-Yun Lo, Tainan (TW); Jing-En Huang, Tainan (TW); Shao-Ying Ting, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 14/576,207

(22) Filed: Dec. 19, 2014

(65) Prior Publication Data
US 2015/0179888 A1     Jun. 25, 2015

(30) Foreign Application Priority Data

Dec. 20, 2013   (TW) .............................. 102147564 A (51) Int. Cl.
| | | |
|---|---|---|
| *H01L 33/02* | (2010.01) | |
| *H01L 33/38* | (2010.01) | |
| *H01L 33/48* | (2010.01) | |
| *H01L 33/50* | (2010.01) | |

(52) U.S. Cl.
CPC .......... *H01L 33/382* (2013.01); *H01L 33/486* (2013.01); *H01L 33/505* (2013.01)

(58) Field of Classification Search
CPC ....... H01L 33/62; H01L 33/44; H01L 33/54; H01L 33/382
USPC .................................. 257/98–102
See application file for complete search history.

(56) References Cited

U.S. PATENT DOCUMENTS

| | | | |
|---|---|---|---|
| 6,661,824 B2 * | 12/2003 | Onishi | .................. H01S 5/4031 |
| | | | 372/23 |
| 6,687,268 B2 * | 2/2004 | Kitamura | ................. G02B 6/42 |
| | | | 372/22 |
| 6,812,503 B2 | 11/2004 | Lin | |
| 7,476,909 B2 | 1/2009 | Nagai | |
| 8,049,244 B2 | 11/2011 | Chen | |
| 8,384,117 B2 | 2/2013 | Song | |
| 8,476,644 B2 | 7/2013 | Illek | |
| 8,680,565 B2 | 3/2014 | Huang | |
| 8,829,549 B2 | 9/2014 | Huang | |
| 2003/0038291 A1 | 2/2003 | Cao | |
| 2003/0230754 A1 | 12/2003 | Steigerwald | |
| 2004/0211972 A1 * | 10/2004 | Du | ...................... H01L 33/0079 |
| | | | 257/99 |

(Continued)

FOREIGN PATENT DOCUMENTS

| | | |
|---|---|---|
| CN | 101867002 A | 10/2010 |
| TW | 201015695 | 4/2010 |

(Continued)

*Primary Examiner* — Michael Lebentritt
(74) *Attorney, Agent, or Firm* — Winston Hsu; Scott Margo (57) ABSTRACT

A semiconductor light emitting structure includes an epitaxial structure, an N-type electrode pad, a P-type electrode pad and an insulation layer. The N-type electrode pad and the P-type electrode pad are disposed on the epitaxial structure apart, wherein the P-type electrode pad has a first upper surface. The insulation layer is disposed on the epitaxial structure and located between the N-type electrode pad and the P-type electrode pad, wherein the insulation layer has a second upper surface. The first upper surface of the P-type electrode pad and the second upper surface of the insulation layer are coplanar.

18 Claims, 9 Drawing Sheets

(56) References Cited

U.S. PATENT DOCUMENTS

| | | |
|---|---|---|
| 2005/0017262 A1 | 1/2005 | Shei |
| 2005/0194605 A1* | 9/2005 | Shelton .................. H01L 33/62 257/99 |
| 2006/0097245 A1 | 5/2006 | Aanegola |
| 2006/0157717 A1 | 7/2006 | Nagai |
| 2006/0279949 A1 | 12/2006 | Shin |
| 2007/0023828 A1* | 2/2007 | Kawamura ......... H01L 29/4236 257/330 |
| 2008/0096297 A1 | 4/2008 | Schiaffino |
| 2008/0230791 A1* | 9/2008 | Lin ...................... H01L 33/382 257/91 |
| 2008/0274573 A1* | 11/2008 | Shi ....................... H01L 27/153 438/34 |
| 2009/0179207 A1 | 7/2009 | Chitnis |
| 2009/0267085 A1* | 10/2009 | Lee .......................... F21K 9/00 257/88 |
| 2010/0051970 A1* | 3/2010 | Ouderkirk ............... H01L 33/44 257/88 |
| 2010/0203661 A1 | 8/2010 | Hodota |
| 2010/0207154 A1 | 8/2010 | Song |
| 2011/0241045 A1* | 10/2011 | Ye ............................ H01L 33/20 257/98 |
| 2011/0291120 A1 | 12/2011 | Tak |
| 2012/0001156 A1* | 1/2012 | Cho .................... H01L 27/1248 257/40 |
| 2012/0001221 A1 | 1/2012 | Choi |
| 2012/0223359 A1 | 9/2012 | Han |
| 2012/0261695 A1 | 10/2012 | Chen |
| 2012/0273749 A1 | 11/2012 | Hsia |
| 2013/0020603 A1 | 1/2013 | Jeong |
| 2013/0049056 A1 | 2/2013 | Choi |
| 2013/0112998 A1 | 5/2013 | Chen |
| 2013/0292719 A1* | 11/2013 | Lee .......................... H01L 33/08 257/93 |
| 2014/0308767 A1* | 10/2014 | Lin .......................... H01L 33/62 438/27 |
| 2014/0353677 A1* | 12/2014 | Tak ..................... H01L 21/0254 257/76 |
| 2015/0069441 A1* | 3/2015 | Lin .......................... H01L 33/62 257/98 |
| 2015/0129918 A1* | 5/2015 | Ikegami ............... H01L 33/505 257/98 |

FOREIGN PATENT DOCUMENTS

| | | |
|---|---|---|
| TW | 201108467 | 3/2011 |
| TW | 201332155 | 8/2013 |
| TW | 201336116 | 9/2013 |
| TW | 201351701 | 12/2013 |
| WO | 2009075551 A2 | 6/2009 |

\* cited by examiner

SEMICONDUCTOR LIGHT EMITTING STRUCTURE AND SEMICONDUCTOR PACKAGE STRUCTURE

BACKGROUND OF THE DISCLOSURE

1. Field of the Disclosure

The disclosure relates to a semiconductor light emitting structure and a semiconductor package structure and, more particularly, to a semiconductor light emitting structure and a semiconductor package structure capable of strengthening an epitaxial structure effectively.

2. Description of the Prior Art

A conventional method for manufacturing a thin-film flip-chip light emitting diode usually comprises steps of forming an epitaxial structure on a substrate first and then forming an N-type electrode and a P-type electrode on the epitaxial structure, so as to form a semiconductor light emitting structure. Afterward, the semiconductor light emitting structure is bonded onto a support base, such that the N-type electrode and the P-type electrode are electrically connected to an N-type bonding pad and a P-type bonding pad of the support base, respectively. Finally, the substrate is removed by a laser removing process, so as to form the thin-film flip-chip light emitting diode. However, since the epitaxial structure is a thin layer, the epitaxial structure may crack due to stresses while the substrate is being removed by the laser removing process. Accordingly, the yield rate of the thin-film flip-chip light emitting diode is reduced and the manufacture cost is increased.

SUMMARY OF THE DISCLOSURE

The disclosure provides a semiconductor light emitting structure and a semiconductor package structure capable of strengthening an epitaxial structure effectively, so as to solve the aforesaid problems.

According to an embodiment of the disclosure, a semiconductor light emitting structure comprises an epitaxial structure, an N-type electrode pad, a P-type electrode pad and an insulation layer. The N-type electrode pad and the P-type electrode pad are disposed on the epitaxial structure apart, wherein the P-type electrode pad has a first upper surface. The insulation layer is disposed on the epitaxial structure and located between the N-type electrode pad and the P-type electrode pad, wherein the insulation layer has a second upper surface. The first upper surface of the P-type electrode pad and the second upper surface of the insulation layer are coplanar.

Preferably, the N-type electrode pad has a third upper surface, and the first upper surface, the second upper surface and a part of the third upper surface are coplanar.

Preferably, the N-type electrode pad has a third upper surface, and the first upper surface, the second upper surface and the third upper surface are coplanar.

Preferably, the semiconductor light emitting structure further comprises a height increasing pad disposed on the epitaxial structure and located between the N-type electrode pad and the P-type electrode pad, wherein the insulation layer covers the height increasing pad.

Preferably, the semiconductor light emitting structure further comprises a substrate, wherein the epitaxial structure is formed on the substrate.

According to another embodiment of the disclosure, a semiconductor package structure comprises a support base, an N-type bonding pad, a P-type bonding pad and the semiconductor light emitting structure mentioned in the above. The N-type bonding pad and the P-type bonding pad are disposed on the support base, and a recess exists between the N-type bonding pad and the P-type bonding pad. The N-type electrode pad of the semiconductor light emitting structure is electrically connected to the N-type bonding pad, and the P-type electrode pad of the semiconductor light emitting structure is electrically connected to the P-type bonding pad.

As mentioned in the above, the disclosure makes the upper surface of the P-type electrode pad and the upper surface of the insulation layer to be coplanar, so as to strengthen the epitaxial structure. Accordingly, the disclosure can effectively prevent the epitaxial structure from cracking due to stresses while the substrate is being removed by a laser removing process. Furthermore, the disclosure may make the upper surface of the P-type electrode pad, the upper surface of the insulation layer and a part or the entire of the upper surface of the N-type electrode pad to be coplanar, so as to further strengthen the epitaxial structure. Moreover, the disclosure may dispose the height increasing pad on the epitaxial structure and use the insulation layer to cover the height increasing pad, so as to ensure that the upper surface of the P-type electrode pad and the upper surface of the insulation layer are coplanar after forming the semiconductor light emitting structure.

These and other objectives of the present disclosure will no doubt become obvious to those of ordinary skill in the art after reading the detailed description of the following embodiments those are illustrated in the various figures and drawings.

DETAILED DESCRIPTION

Figure 1:
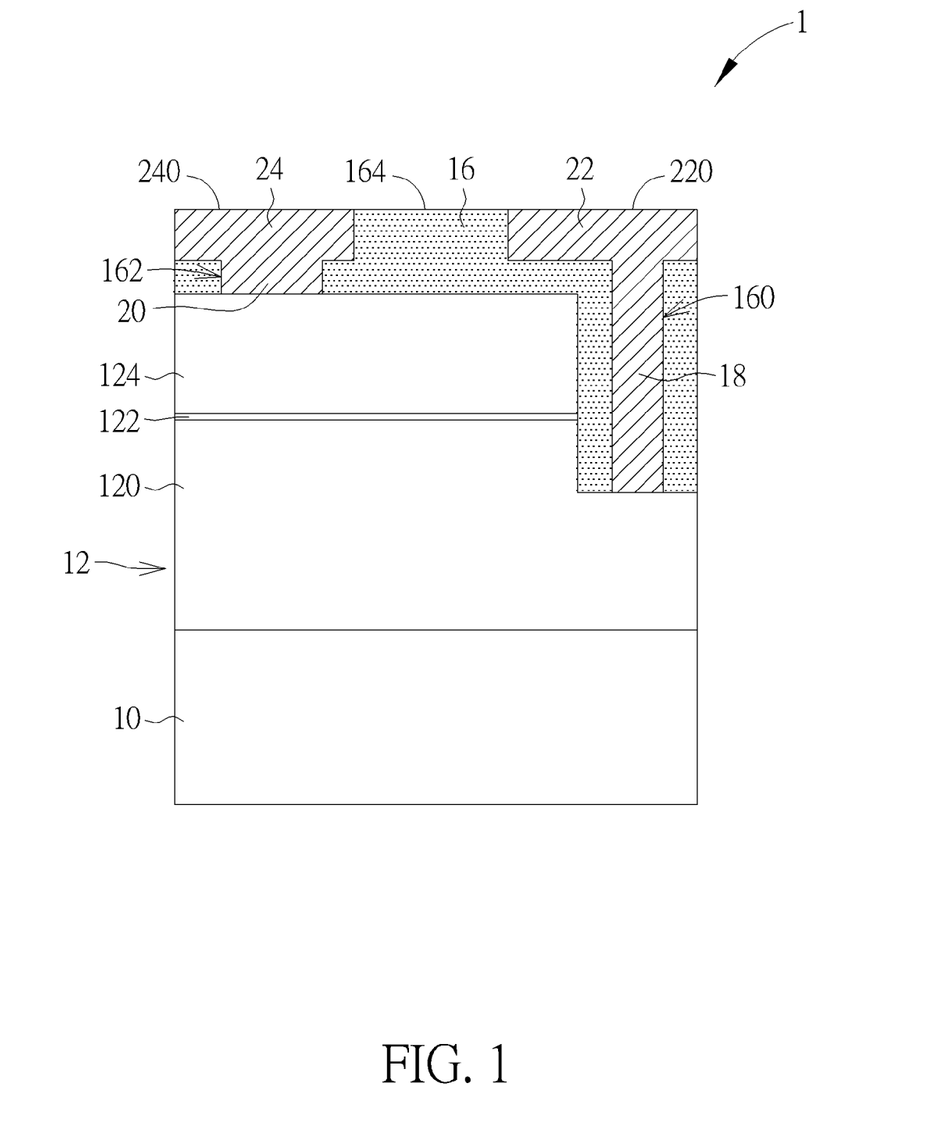
FIG. 1 is a schematic view illustrating a semiconductor light emitting structure according to a first embodiment of the disclosure.

Referring to FIG. 1, FIG. 1 is a schematic view illustrating a semiconductor light emitting structure 1 according to a first embodiment of the disclosure. The semiconductor light emitting structure 1 of the disclosure comprises an epitaxial structure 12 formed on a substrate 10, wherein the epitaxial structure 12 comprises an N-type semiconductor layer 120, a light emitting layer 122 and a P-type semiconductor layer 124, and the light emitting layer 122 is located between the N-type semiconductor layer 120 and the P-type semiconductor layer 124. In this embodiment, the substrate 10 may be a glass substrate, a plastic substrate, a sapphire substrate, a ceramic substrate or other support substrates, the N-type semiconductor layer 120 may be an N-type GaN layer, and the P-type semiconductor layer 124 maybe a P-type GaN layer. It should be noted that the light emitting principle of the epitaxial structure 12 is well known by one skilled in the art, so the related explanation will not be depicted herein again. Afterward, an N-type electrode pad 22 and a P-type electrode pad 24 are disposed on the epitaxial structure 12 apart, and an insulation layer 16 is disposed on the epitaxial structure 12 and located between the N-type electrode pad 22 and the P-type electrode pad 24, wherein the N-type electrode pad 22 and the P-type electrode pad 24 are electrically connected to the N-type semiconductor layer 120 and the P-type semiconductor layer 124, respectively. The method for manufacturing the aforesaid structure is to form two holes 160, 162 at appropriate positions of the insulation layer 16 corresponding to the N-type semiconductor layer 120 and the P-type semiconductor layer 124, and then fill appropriate conductive material into the holes 160, 162 to form an N-type conductive structure 18 and a P-type conductive structure 20 in the holes 160, 162. Accordingly, the N-type electrode pad 22 is electrically connected to the N-type semiconductor layer 120 through the N-type conductive structure 18, and the P-type electrode pad 24 is electrically connected to the P-type semiconductor layer 124 through the P-type conductive structure 20.

As shown in FIG. 1, the N-type electrode pad 22 and the P-type electrode pad 24 are disposed on the epitaxial structure 12 apart, wherein the P-type electrode pad 24 has a first upper surface 240, the insulation layer 16 located between the N-type electrode pad 22 and the P-type electrode pad 24 has a second upper surface 164, and the N-type electrode pad 22 has a third upper surface 220. In this embodiment, the second upper surface 164 of the insulation layer 16 connects the first upper surface 240 of the P-type electrode pad 24 and the third upper surface 220 of the N-type electrode pad 22.

In this embodiment, the disclosure disposes the insulation layer 16 between the P-type electrode pad 24 and the N-type electrode pad 22 and makes the first upper surface 240 of the P-type electrode pad 24 and the second upper surface 164 of the insulation layer 16 to be coplanar, so as to strengthen the epitaxial structure 12. Accordingly, the disclosure can effectively prevent the epitaxial structure 12 from cracking due to stresses while the substrate 10 is being removed by a laser removing process. Preferably, the first upper surface 240 of the P-type electrode pad 24, the second upper surface 164 of the insulation layer 16 and the third upper surface 220 of the N-type electrode pad 22 are coplanar. Preferably, the second upper surface 164 of the insulation layer 16 connects the first upper surface 240 of the P-type electrode pad 24 and the third upper surface 220 of the N-type electrode pad 22, such that there is no gap between the P-type electrode pad 24 and the N-type electrode pad 22. Accordingly, the semiconductor light emitting structure 1 can be solider and stronger.

Figure 2:
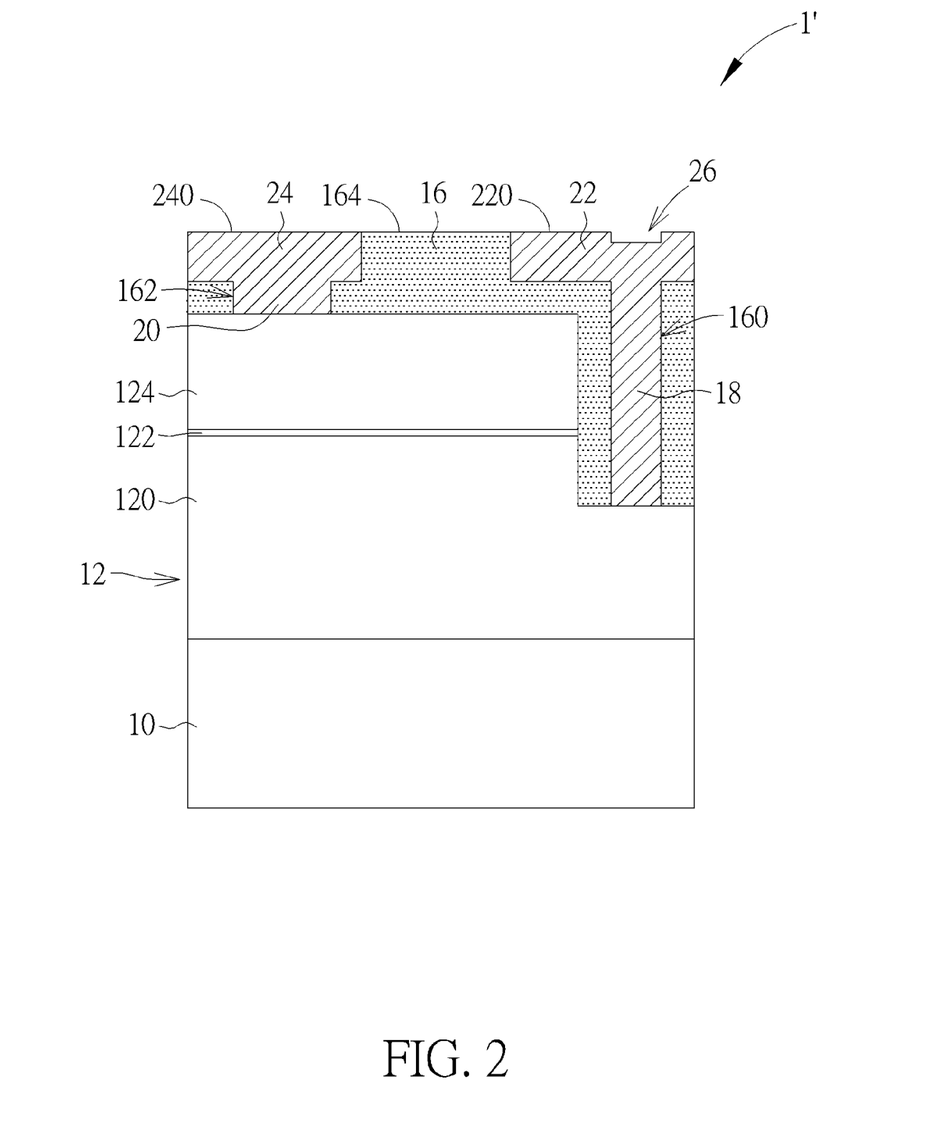
FIG. 2 is a schematic view illustrating a semiconductor light emitting structure according to a second embodiment of the disclosure.

Referring to FIG. 2 along with FIG. 1, FIG. 2 is a schematic view illustrating a semiconductor light emitting structure 1' according to a second embodiment of the disclosure. The main difference between the semiconductor light emitting structure 1' and the aforesaid semiconductor light emitting structure 1 is that a recess 26 may exist after forming the N-type electrode pad 22 since there is a height difference between the P-type semiconductor layer 124 and the N-type semiconductor layer 120, such that the first upper surface 240 of the P-type electrode pad 24, the second upper surface 164 of the insulation layer 16 and a part of the third upper surface 220 of the N-type electrode pad 22 are coplanar. It should be noted that as long as the first upper surface 240 of the P-type electrode pad 24 and the second upper surface 164 of the insulation layer 16 are coplanar, the epitaxial structure 12 can be strengthened. This embodiment can save more manufacture time than the semiconductor light emitting structure 1 shown in FIG. 1 since this embodiment forms the conductive structures and the electrode pads at the same time.

Figure 3:
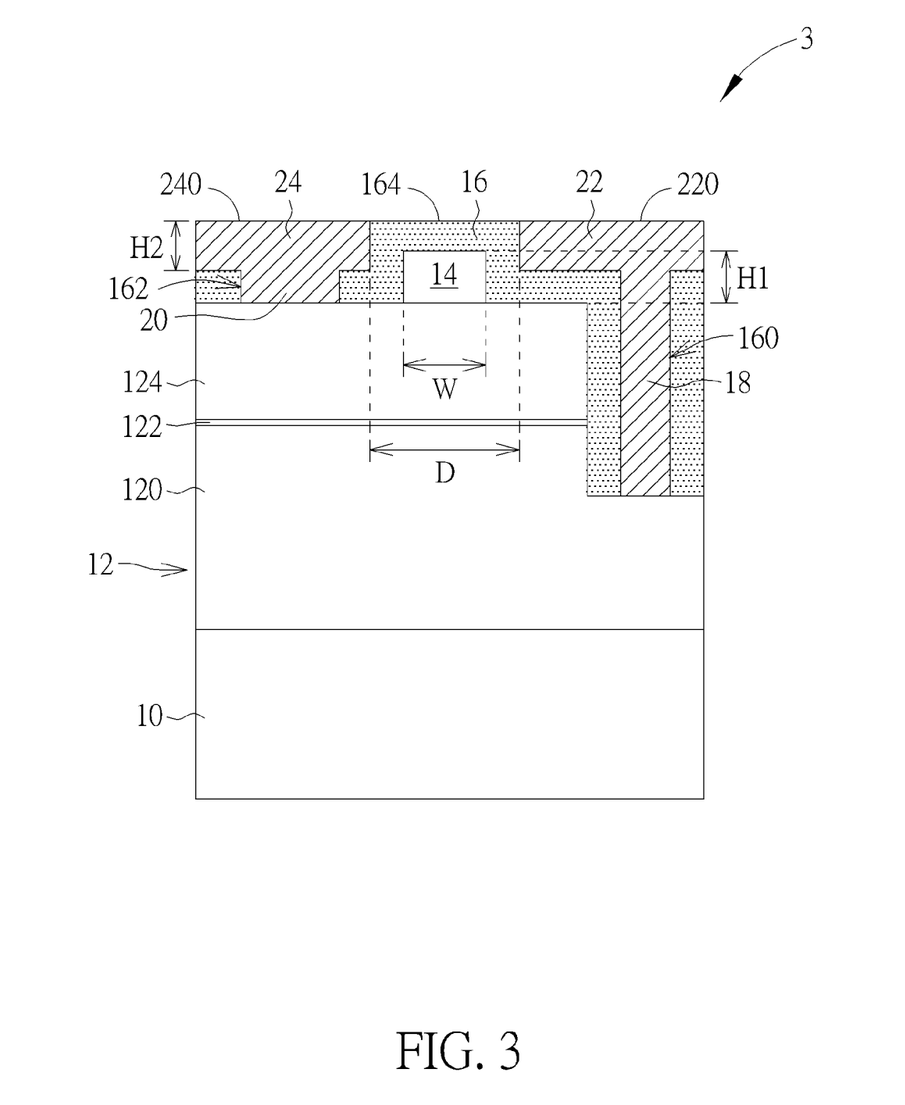
FIG. 3 is a schematic view illustrating a semiconductor light emitting structure according to a third embodiment of the disclosure.

Referring to FIG. 3 along with FIG. 1, FIG. 3 is a schematic view illustrating a semiconductor light emitting structure 3 according to a third embodiment of the disclosure. The main difference between the semiconductor light emitting structure 3 and the aforesaid semiconductor light emitting structure 1 is that the semiconductor light emitting structure 3 disposes a height increasing pad 14 on the epitaxial structure 12 and the insulation layer 16 covers the height increasing pad 14, wherein a material of the height increasing pad 14 may be, but not limited to, $SiO_2$ or metal. It should be noted that if the material of the height increasing pad 14 is metal, the height increasing pad 14 can cushion stresses well since the metal has better malleability; and if the material of the height increasing pad 14 is $SiO_2$, the height increasing pad 14 has good insulation effect . Furthermore, since the height increasing pad 14 is located between the N-type electrode pad 22 and the P-type electrode pad 24 and the insulation layer 16 covers the height increasing pad 14, a width W of the height increasing pad 14 is smaller than a maximum horizontal distance D between the N-type electrode pad 22 and the P-type electrode pad 24. The objective of disposing the height increasing pad 14 is to make the second upper surface 164 of the insulation layer 16 and the first upper surface 240 of the P-type electrode pad 24 to be coplanar more easily. It should be noted that, in this embodiment, since the P-type conductive structure 20 is filled in the hole 162 of the insulation layer 16, a thickness of the P-type conductive structure 20 is similar to a thickness of the insulation layer 16. Accordingly, a height H1 of the height increasing pad 14 must be similar to a height H2 of the P-type electrode pad 24, such that the first upper surface 240 of the P-type electrode pad 24 and the second upper surface 164 of the insulation layer 16 can be coplanar.

Figure 4:
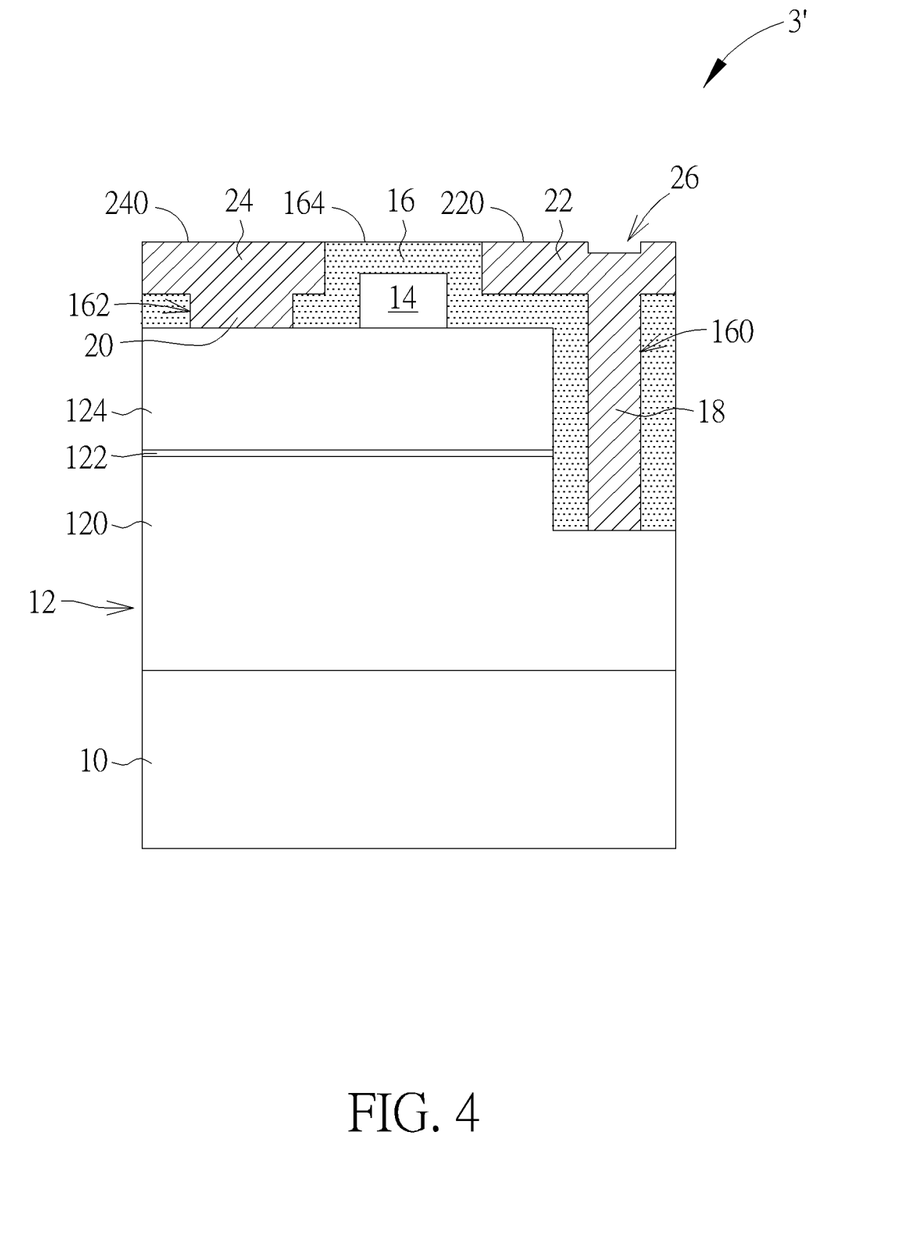
FIG. 4 is a schematic view illustrating a semiconductor light emitting structure according to a fourth embodiment of the disclosure.

Referring to FIG. 4 along with FIG. 3, FIG. 4 is a schematic view illustrating a semiconductor light emitting structure 3' according to a fourth embodiment of the disclosure. The main difference between the semiconductor light emitting structure 3' and the aforesaid semiconductor light emitting structure 3 is that a recess 26 exists on the N-type electrode pad 22 of the semiconductor light emitting structure 3', such that the first upper surface 240 of the P-type electrode pad 24, the second upper surface 164 of the insulation layer 16 and a part of the third upper surface 220 of the N-type electrode pad 22 are coplanar. It should be noted that as long as the first upper surface 240 of the P-type electrode pad 24 and the second upper surface 164 of the insulation layer 16 are coplanar, the epitaxial structure 12 can be strengthened. Furthermore, the same elements in FIG. 4 and FIG. 3 are represented by the same numerals, so the repeated explanation will not be depicted herein again.

Figure 5:
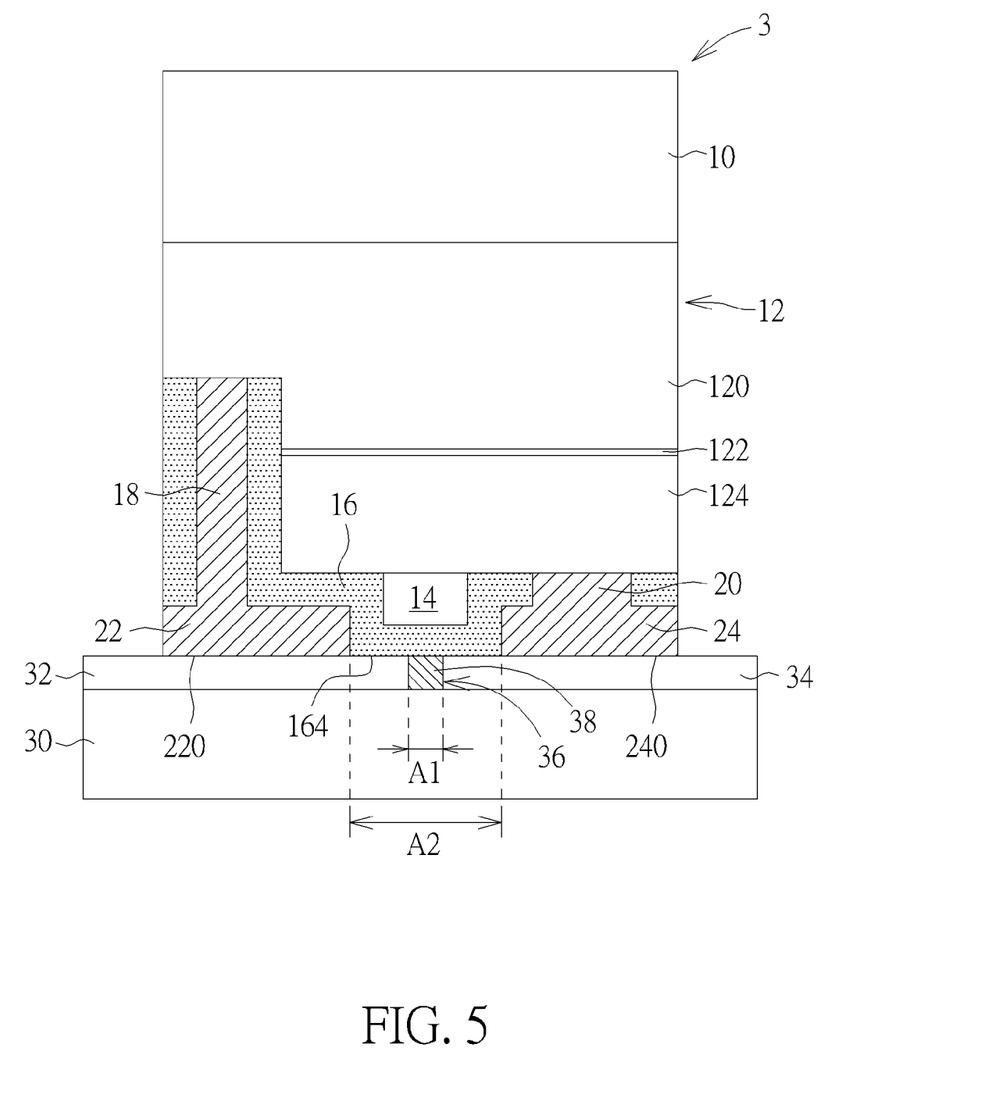
FIGS. 5 and 6 are schematic views illustrating the process of manufacturing a semiconductor package structure according to a fifth embodiment of the disclosure.
Figure 6:
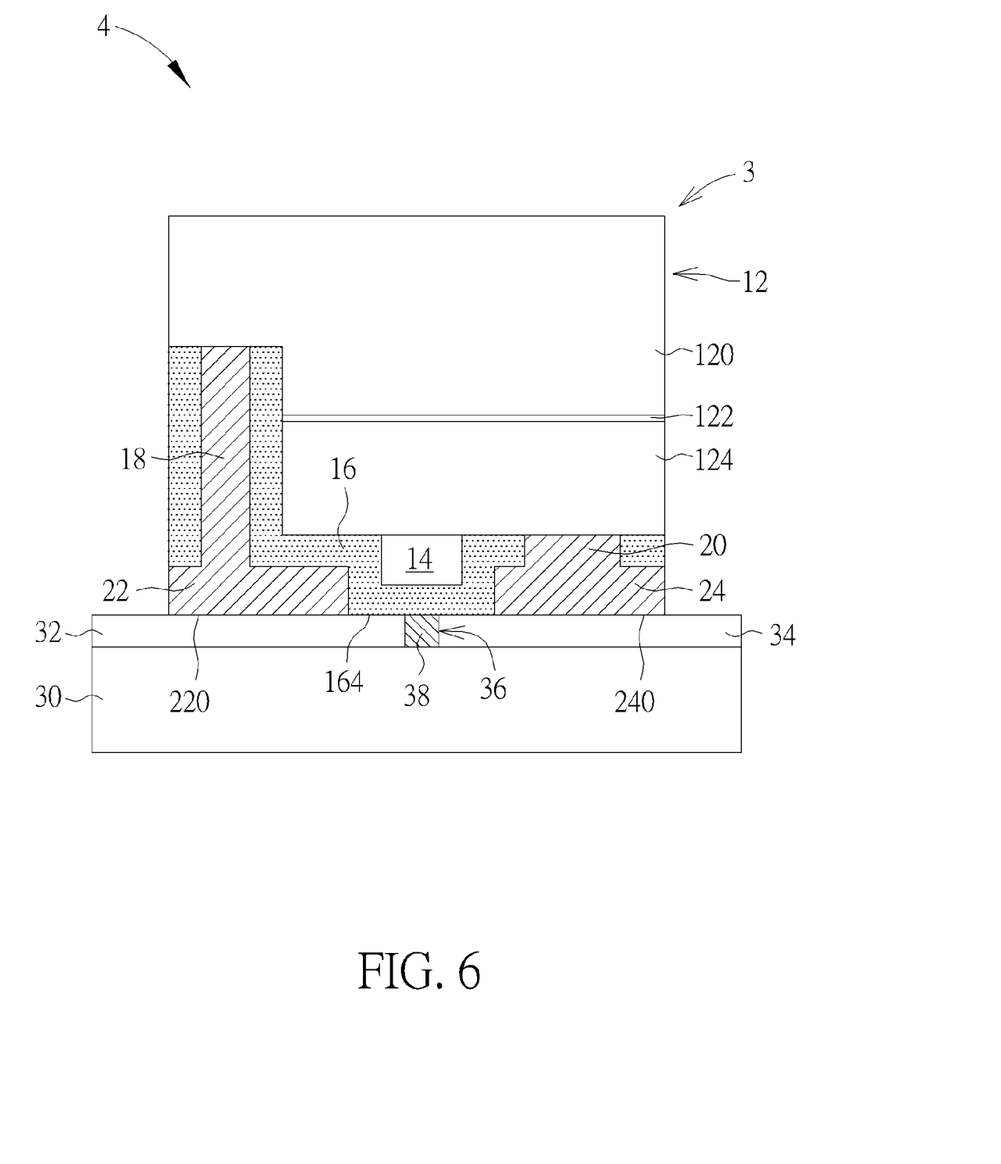

Referring to FIGS. 5 and 6 alone with FIG. 3, FIGS. 5 and 6 are schematic views illustrating the process of manufacturing a semiconductor package structure 4 according to a fifth embodiment of the disclosure. As shown in FIG. 5, the disclosure may provide a support base 30, an N-type bonding pad 32 and a P-type bonding pad 34, wherein the N-type bonding pad 32 and the P-type bonding pad 34 are disposed on the support base 30, and a recess 36 exists between the N-type bonding pad 32 and the P-type bonding pad 34 such that the N-type bonding pad 32 and the P-type bonding pad 34 are apart.

After finishing the semiconductor light emitting structure 3 shown in FIG. 3, the N-type electrode pad 22 and the P-type electrode pad 24 of the semiconductor light emitting structure 3 may be bonded onto the N-type bonding pad 32 and the P-type bonding pad 34 of the support base, respectively, such that the N-type electrode pad 22 is electrically connected to the N-type bonding pad 32 and the P-type electrode pad 24 is electrically connected to the P-type bonding pad 34, wherein a part of the N-type bonding pad 32 is not covered by the N-type electrode pad 22 and a part of the P-type bonding pad 34 is not covered by the P-type electrode pad 24, so as to connect an external power source. In this embodiment, a projection area A2 of the second upper surface 164 of the insulation layer 16 projected on the support base 30 is larger than a projection area A1 of the recess 36 projected on the support base 30, such that the second upper surface 164 of the insulation layer 16 covers the recess 36 completely. However, the disclosure is not limited to the aforesaid manner. The projection area A2 of the second upper surface 164 of the insulation layer 16 projected on the support base 30 may also be equal to the projection area A1 of the recess 36 projected on the support base 30. Preferably, there is an insulation material 38 disposed in the recess 36, so as to separate the N-type bonding pad 32 and the P-type bonding pad 34 from each other insulatingly. Furthermore, a thickness of the insulation material 38 is similar to a thickness of the P-type bonding pad 34. Preferably, the thickness of the insulation material 38 is similar to thicknesses of the P-type bonding pad 34 and the N-type bonding pad 32, such that the insulation material 38 can be attached to the second upper surface 164 of the insulation layer 16, so as to prevent a gap from existing between the insulation material 38 and the second upper surface 164 of the insulation layer 16.

Afterward, as shown in FIG. 6, the disclosure may remove the substrate 10 by a laser removing process to finish the semiconductor package structure 4. As mentioned in the above, since the first upper surface of the P-type electrode pad 24 and the second upper surface 164 of the insulation layer 16 are coplanar, the disclosure can effectively prevent the epitaxial structure 12 from cracking due to stresses while the substrate 10 is being removed by the laser removing process.

Figure 7:
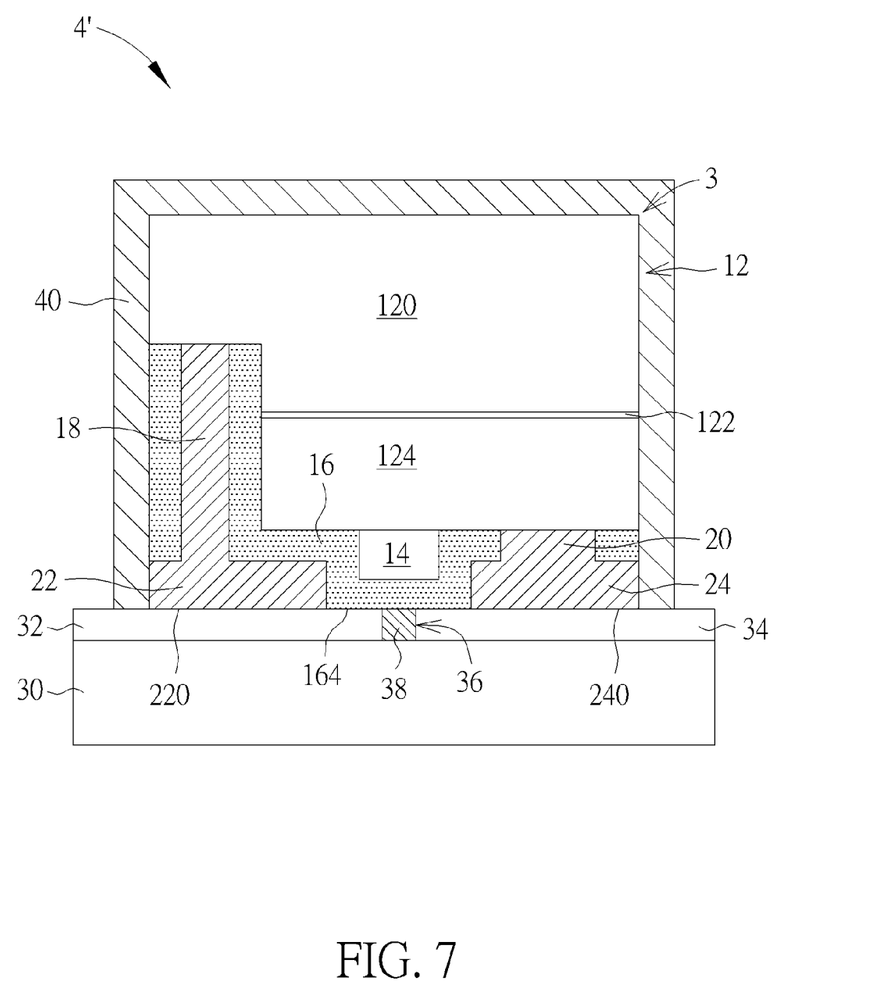
FIG. 7 is a schematic view illustrating a semiconductor package structure according to a sixth embodiment of the disclosure.

Referring to FIG. 7 along with FIG. 6, FIG. 7 is a schematic view illustrating a semiconductor package structure 4' according to a sixth embodiment of the disclosure. The main difference between the semiconductor package structure 4' and the aforesaid semiconductor package structure 4 is that the semiconductor package structure 4' further comprises a wavelength converting member 40 covering the semiconductor light emitting structure 3. The wavelength converting member 40 may be made of, but not limited to, a mixture of a transparent glue and phosphor powders. The wavelength converting member 40 may convert a wavelength of a light emitted by the semiconductor light emitting structure 3 into another wavelength, so as to change a color of the light emitted by the semiconductor light emitting structure 3. It should be noted that the same elements in FIG. 7 and FIG. 6 are represented by the same numerals, so the repeated explanation will not be depicted herein again.

Figure 8:
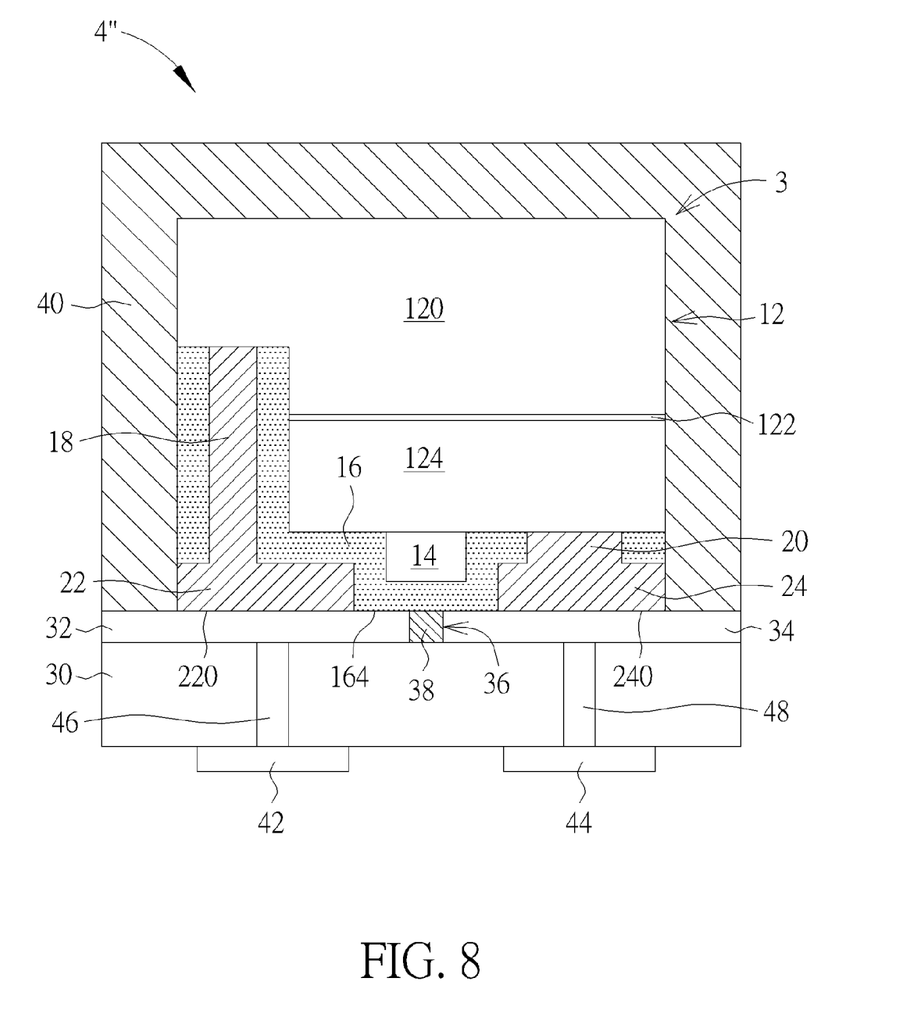
FIG. 8 is a schematic view illustrating a semiconductor package structure according to a seventh embodiment of the disclosure.

Referring to FIG. 8 along with FIG. 7, FIG. 8 is a schematic view illustrating a semiconductor package structure 4" according to a seventh embodiment of the disclosure. The main difference between the semiconductor package structure 4" and the aforesaid semiconductor package structure 4' is that the semiconductor package structure 4" further comprises two external electrodes 42, 44 and the two external electrodes 42, 44 may be electrically connected to the N-type bonding pad 32 and the P-type bonding pad 34 through conductive materials 46, 48, respectively. Accordingly, when the semiconductor package structure 4" is disposed on a circuit board (not shown), the external electrodes 42, 44 may be electrically connected to a circuit layout of the circuit board. It should be noted that the same elements in FIG. 8 and FIG. 7 are represented by the same numerals, so the repeated explanation will not be depicted herein again.

Figure 9:
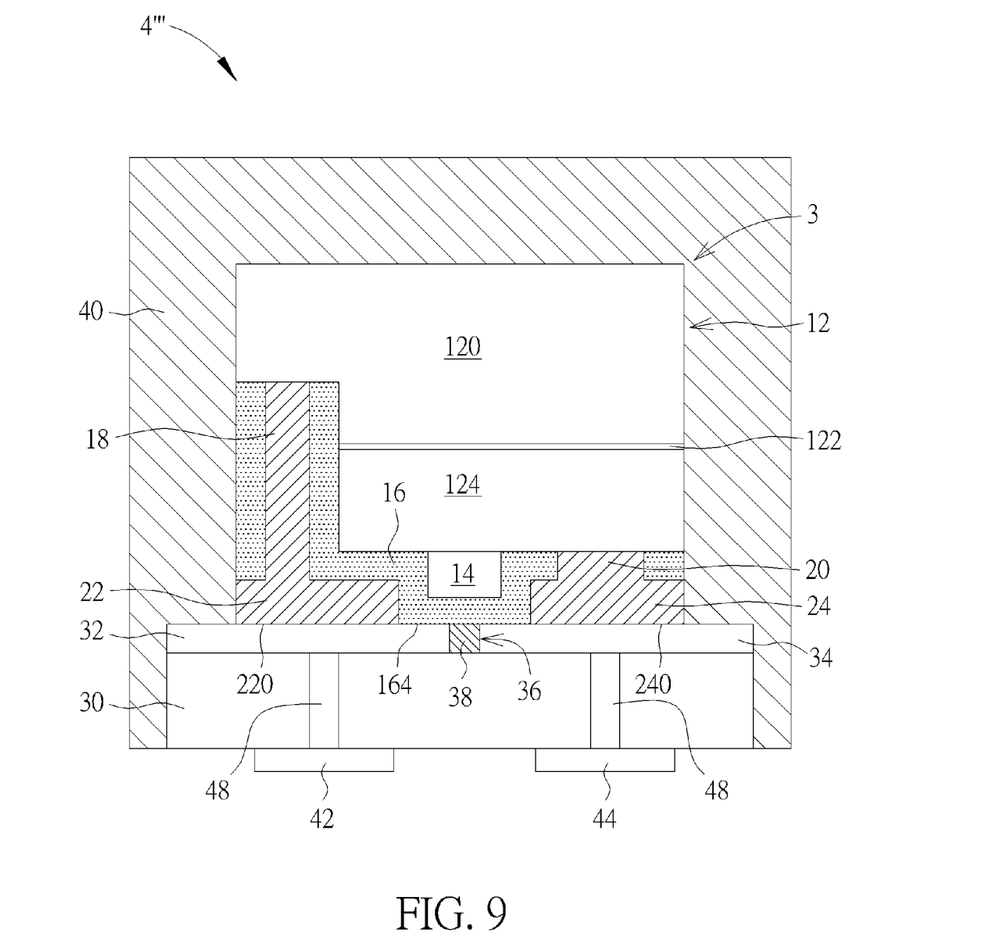
FIG. 9 is a schematic view illustrating a semiconductor package structure according to an eighth embodiment of the disclosure.

Referring to FIG. 9 along with FIG. 8, FIG. 9 is a schematic view illustrating a semiconductor package structure 4'" according to an eighth embodiment of the disclosure. The main difference between the semiconductor package structure 4'" and the aforesaid semiconductor package structure 4" is that the wavelength converting member 40 of the semiconductor package structure 4'" covers the semiconductor light emitting structure 3 and is extended to a side wall of the support base 30. In other words, the disclosure can determine a cover range of the wavelength converting member 40 according to practical light emitting requirement. It should be noted that the same elements in FIG. 9 and FIG. 8 are represented by the same numerals, so the repeated explanation will not be depicted herein again.

As mentioned in the above, the disclosure makes the upper surface of the P-type electrode pad and the upper surface of the insulation layer to be coplanar, so as to strengthen the epitaxial structure. Accordingly, the disclosure can effectively prevent the epitaxial structure from cracking due to stresses while the substrate is being removed by a laser removing process. Furthermore, the disclosure may make the upper surface of the P-type electrode pad, the upper surface of the insulation layer and a part or the entire of the upper surface of the N-type electrode pad to be coplanar, so as to further strengthen the epitaxial structure. Moreover, the disclosure may dispose the height increasing pad on the epitaxial structure and use the insulation layer to cover the height increasing pad, so as to ensure that the upper surface of the P-type electrode pad and the upper surface of the insulation layer are coplanar after forming the semiconductor light emitting structure. Still further, the disclosure may use the wavelength converting member to cover the semiconductor light emitting structure, so as to change the color of the light emitted by the semiconductor light emitting structure.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A semiconductor light emitting structure comprising:
an epitaxial structure;
a first type electrode pad and a second type electrode pad disposed on the epitaxial structure apart, the second type electrode pad having a first upper surface;
a height increasing pad disposed on the epitaxial structure and located between the first type electrode pad and the second type electrode pad without directly contacting the first type electrode pad and the second type electrode pad; and an insulation layer disposed on the epitaxial structure and located between the first type electrode pad and the second type electrode pad, the insulation layer and the height increasing pad being stacked together to form a second upper surface;

wherein the first upper surface and the second upper surface are coplanar.

2. The semiconductor light emitting structure of claim 1, wherein the first type electrode pad has a third upper surface, and the first upper surface, the second upper surface and a part of the third upper surface are coplanar.

3. The semiconductor light emitting structure of claim 1, wherein a height of the height increasing pad is similar to a height of the second type electrode pad.

4. A semiconductor package structure comprising:
a support base;
a first type bonding pad and a second type bonding pad disposed on the support base, a recess existing between the first type bonding pad and the second type bonding pad; and
a semiconductor light emitting structure of claim 1, the first type electrode pad being electrically connected to the first type bonding pad, the second type electrode pad being electrically connected to the second type bonding pad.

5. The semiconductor package structure of claim 4, further comprising an insulation material disposed in the recess.

6. The semiconductor package structure of claim 4, further comprising a wavelength converting member covering the semiconductor light emitting structure.

7. A semiconductor light emitting structure comprising:
an epitaxial structure;
a first type electrode pad and a second type electrode pad disposed on the epitaxial structure apart;
a height increasing pad disposed on the epitaxial structure and located between and spaced from the first type electrode pad and the second type electrode pad; and
an insulation layer disposed on the epitaxial structure, the insulation layer and the height increasing pad being stacked together, wherein an upper surface of the height increasing pad is lower than an upper surface of one of the first type electrode pad and the second type electrode pad.

8. The semiconductor light emitting structure of claim 7, wherein an upper surface of the second type electrode pad, an upper surface of the insulation layer, and a part of an upper surface of the first type electrode pad are coplanar.

9. The semiconductor light emitting structure of claim 7, wherein a height of the height increasing pad is similar to a height of the second type electrode pad.

10. A semiconductor package structure comprising:
a support base;
a first type bonding pad and a second type bonding pad disposed on the support base, a recess existing between the first type bonding pad and the second type bonding pad; and
a semiconductor light emitting structure of claim 7, the first type electrode pad being electrically connected to the first type bonding pad, the second type electrode pad being electrically connected to the second type bonding pad.

11. The semiconductor package structure of claim 10, further comprising an insulation material disposed in the recess.

12. The semiconductor package structure of claim 10, further comprising a wavelength converting member covering the semiconductor light emitting structure.

13. A semiconductor light emitting structure comprising:
an epitaxial structure;
a first type electrode pad and a second type electrode pad disposed on the epitaxial structure apart;
a height increasing pad disposed on the epitaxial structure and located between and spaced from the first type electrode pad and the second type electrode pad; and
an insulation layer disposed on the epitaxial structure, the insulation layer located between the first type electrode pad and the height increasing pad, and located between the second type electrode pad and the height increasing pad.

14. The semiconductor light emitting structure of claim 13, wherein an upper surface of the second type electrode pad, an upper surface of the insulation layer, and a part of an upper surface of the first type electrode pad are coplanar.

15. The semiconductor light emitting structure of claim 13, wherein a height of the height increasing pad is similar to a height of the second type electrode pad.

16. A semiconductor package structure comprising:
a support base;
a first type bonding pad and a second type bonding pad disposed on the support base, a recess existing between the first type bonding pad and the second type bonding pad; and
a semiconductor light emitting structure of claim 13, the first type electrode pad being electrically connected to the first type bonding pad, the second type electrode pad being electrically connected to the second type bonding pad.

17. The semiconductor package structure of claim 16, further comprising an insulation material disposed in the recess.

18. The semiconductor package structure of claim 16, further comprising a wavelength converting member covering the semiconductor light emitting structure.

* * * * *